(12) United States Patent
Goto

(10) Patent No.: US 9,182,545 B2
(45) Date of Patent: Nov. 10, 2015

(54) WAFER LEVEL OPTICAL DEVICE

(71) Applicant: Empire Technology Development LLC, Wilmington, DE (US)

(72) Inventor: Hiroshi Goto, Imaraki (JP)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 14/009,098

(22) PCT Filed: Oct. 25, 2012

(86) PCT No.: PCT/US2012/062002
§ 371 (c)(1),
(2) Date: Sep. 30, 2013

(87) PCT Pub. No.: WO2014/065805
PCT Pub. Date: May 1, 2014

(65) Prior Publication Data
US 2014/0169730 A1 Jun. 19, 2014

(51) Int. Cl.
*G02B 6/12* (2006.01)
*G02B 6/13* (2006.01)
*H01L 31/0232* (2014.01)
*H01L 27/146* (2006.01)
*H04N 5/225* (2006.01)

(52) U.S. Cl.
CPC .. *G02B 6/12* (2013.01); *G02B 6/13* (2013.01); *H01L 27/14618* (2013.01); *H01L 27/14625* (2013.01); *H01L 31/02325* (2013.01); *H04N 5/2254* (2013.01); *H01L 2924/0002* (2013.01)

(58) Field of Classification Search
CPC ...... G02B 6/12; G02B 6/13; H01L 27/14618; H01L 14/14625; H01L 31/02325; H04N 5/2254
USPC .......................................................... 385/14
See application file for complete search history.

(56) References Cited

U.S. PATENT DOCUMENTS

| | | | | |
|---|---|---|---|---|
| 5,617,131 A | * | 4/1997 | Murano et al. | 347/233 |
| 7,002,659 B1 | * | 2/2006 | Yamazaki et al. | 349/155 |
| 2002/0063302 A1 | * | 5/2002 | Furumiya et al. | 257/432 |
| 2007/0187789 A1 | * | 8/2007 | Kathman et al. | 257/432 |
| 2008/0050081 A1 | | 2/2008 | Goebel et al. | |
| 2009/0321861 A1 | * | 12/2009 | Oliver et al. | 257/432 |

OTHER PUBLICATIONS

"Introduction to wafer-level optical mounting technology", Tessera, Inc; http://tessera.com/Pages/tessera.aspx, retrieved on Sep. 30, 2013.

(Continued)

*Primary Examiner* — Jerry Blevins
(74) *Attorney, Agent, or Firm* — Turk IP Law, LLC

(57) ABSTRACT

Technologies are generally described for fabricating a wafer level optical device using a plurality of substrates made of materials with a substantially compatible (e.g., same or similar) thermal expansion coefficient. An example device may include a first substrate including light-receiving or light-emitting elements, and a second substrate including optical elements located within through-holes of the second substrate. The through-holes can be configured to substantially align each of the light-receiving or light-emitting elements with a corresponding one of the optical elements. A thermal expansion coefficient of the second substrate can be configured to be substantially the same to a thermal expansion coefficient of the first substrate.

22 Claims, 4 Drawing Sheets

(56) References Cited

OTHER PUBLICATIONS

"Introduction to wafer-level lens fabrication by nanoimprinting", Suss MicroTech AG; http://www.suss.com/jp/markets/nanoimprint-lithography/microlens-imprint-lithography.html, retrieved on Jul. 11, 2013.

International Search Report and Written Opinion for PCT/US12/62002, filed Oct. 25, 2012, mailed Mar. 1, 2013.

* cited by examiner

WAFER LEVEL OPTICAL DEVICE

CROSS REFERENCE TO RELATED APPLICATIONS

This Application is the National Stage filing under 35 U.S.C §371 of PCT Application Ser. No. PCT/US 2012/062002 filed on Oct. 25, 2012. The disclosure of the PCT Application is herein incorporated by reference in its entirety.

BACKGROUND

Unless otherwise indicated herein, the approaches described in this section are not prior art to the claims in this application and are not admitted to be prior art by inclusion in this section.

Digital electronic devices such as mobile phones and tablet computers can employ various types of optical devices such as image sensing modules and display modules. In such optical devices, optical elements such as lenses or diffraction gratings can be integrated with light-emitting elements such as LDs (laser diodes) and LEDs (light-emitting diodes), or light-receiving elements such as PDs (photodiodes) and CCDs (charge-coupled devices). In particular, as the size (e.g., thickness) of portable electronic devices is gradually decreasing, there are ever-increasing demands for further reduction in the size of optical elements installed in such devices.

Conventionally, optical devices may be fabricated by assembling optical elements and their corresponding light-emitting or light-receiving elements, which may be produced separately from the optical elements. In particular, optical devices such as lenses may be fabricated by molding technology such as injection molding. Further, light-emitting or light-receiving elements may be fabricated in the form of a wafer by semiconductor fabrication processes and diced out in the form of chips from the wafer. Such chips may then be individually assembled with corresponding optical elements. With this approach, however, it may be difficult to reduce the size of the optical devices. Also, it may take a considerable time for the assembly process, resulting in low production efficiency and high costs.

To resolve various problems, another fabrication process has been proposed in the related art, where multiple optical elements may be fabricated in the form of a wafer and mounted together at the wafer level with a corresponding number of light-receiving (or light-emitting) elements fabricated by semiconductor processes. In this process, since both optical elements and its corresponding light-receiving elements are fabricated in the form of a wafer, the assembling of these two elements can be performed in a more efficient manner. Also, since the assembling of the corresponding elements is conducted at the wafer-level, an optical device with a reduced size can be produced.

However, in such wafer-level optical device fabrication, to ensure precise optical performance, it is important to align the positions of the corresponding elements formed in different wafers. Specifically, when multiple wafers are stacked and assembled with each other, the optical axes of optical elements such as lenses should be aligned with the centers of light-receiving elements over the entire wafer planes. For example, if the wafers have a size of 8 inches (which is equivalent to about 200 mm), the alignment process should be performed within a tolerance of about 1 μm. Further, in case the wafers are made of different materials with different thermal expansion coefficients, it may be difficult to ensure positional precision in aligning the corresponding elements over the entire wafer planes, due to various temperature conditions during the fabrication process. In particular, since optical elements such as lenses may generally be fabricated using plastic materials, there may be a considerable disparity in thermal expansion coefficient relative to the silicon substrates on which light-receiving elements are formed.

SUMMARY

Technologies are generally described for fabricating a wafer level optical device using multiple substrates made of materials with a substantially similar thermal expansion coefficient.

Various example devices described herein may include one or more of a first substrate including light-receiving or light-emitting elements, and a second substrate including optical elements located within through-holes of the second substrate. The through-holes can be configured to substantially align each of the light-receiving or light-emitting elements with a corresponding one of the optical elements. A thermal expansion coefficient of the second substrate can be configured to be substantially the same or similar to a thermal expansion coefficient of the first substrate. Some example devices may further include a spacer substrate disposed between the first and the second substrates. The spacer substrate may contain at least one of quartz glass material and/or silicon material. Further, the first substrate may contain silicon material, and the second substrate may contain at least one of quartz glass material, silicon material and/or ceramic material such as silicon nitride ($Si_3N_4$) and/or aluminum oxide ($Al_2O_3$). The optical elements in the second substrate may contain plastic material such as ultraviolet curing resin and/or thermosetting resin.

In some examples, optical devices are described that may include one or more of a first substrate including light-receiving or light-emitting elements, a spacer substrate disposed on the first substrate, and a second substrate disposed on the spacer substrate. The second substrate can be configured to include optical elements located within through-holes of the second substrate. The through-holes can be configured to substantially align each of the light-receiving or light-emitting elements with a corresponding one of the optical elements. A thermal expansion coefficient of the second substrate can be configured to be substantially the same to a thermal expansion coefficient of the first substrate. The spacer substrate may contain at least one of quartz glass material and/or silicon material. Further, the first substrate may contain silicon material, and the second substrate may contain at least one of quartz glass material, silicon material and/or ceramic material such as $Si_3N_4$ and/or $Al_2O_3$. The optical elements in the second substrate may contain plastic material such as ultraviolet curing resin and/or thermosetting resin.

In some examples, methods for fabricating optical devices are described. The example methods may include providing a first substrate including multiple light-receiving or light-emitting elements. A second substrate may be provided to include multiple through-holes, where multiple optical elements are formed such that each of the multiple through-holes includes a corresponding one of the multiple optical elements. In some methods, the second substrate may be disposed on the first substrate such that each of the multiple optical elements is substantially aligned with a corresponding one of the multiple light-receiving or light-emitting elements. A thermal expansion coefficient of the second substrate can be configured to be substantially the same to a thermal expansion coefficient of the first substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
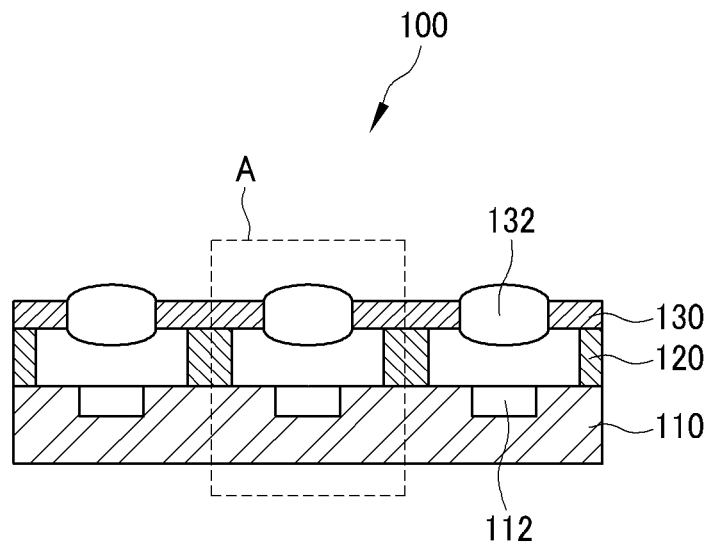
FIG. 1 schematically shows a cross-sectional view of an illustrative optical device.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to optical devices and methods related to fabricating a wafer level optical device.

Briefly stated, technologies are generally described for using multiple substrates made of materials with a substantially same or similar thermal expansion coefficient to fabricate a wafer level optical device, which may be utilized in a digital electronic device such as a digital camera, a mobile phone and a tablet computer. Example optical devices may include a first substrate including light-receiving or light-emitting elements, and a second substrate including optical elements located within through-holes of the second substrate. A thermal expansion coefficient of the second substrate can be configured to be substantially compatible with (e.g., the same or similar to) a thermal expansion coefficient of the first substrate. Thus, the through-holes can substantially align each of the light-receiving or light-emitting elements with a corresponding one of the optical elements.

In some embodiments, the first substrate may contain silicon material, and the second substrate may contain at least one of quartz glass material, silicon material and/or ceramic material such as silicon nitride ($Si_3N_4$) and/or aluminum oxide ($Al_2O_3$). Further, the optical devices may further include a spacer substrate disposed between the first and the second substrate. The spacer substrate may contain at least one of quartz glass material and/or silicon material. The optical elements in the second substrate may contain plastic material such as ultraviolet curing resin and/or thermosetting resin.

FIG. 1 schematically shows a cross-sectional view of illustrative optical device 100, which is arranged in accordance with at least some embodiments described herein.

As depicted, example optical devices 100 may include first substrate 110 including multiple light-receiving devices 112 on a top surface of first substrate 110. On first substrate 110, second substrate 130 including multiple optical elements 132 located in multiple through-holes is disposed via spacer substrate 120. Although spacer substrate 120 is illustrated in FIG. 1, in some examples the first substrate 110 may be configured to be disposed on second substrate 130 without spacer substrate 120. In some additional embodiments, spacer substrate 120 may be integrated into either first substrate 110 or second substrate 130.

In some embodiments, light-receiving elements 112 may include at least one of PDs (photodiodes) and CCDs (charge-coupled devices). Alternatively, instead of light-receiving elements 112, light-emitting elements such as LDs (laser diodes) and LEDs (light-emitting diodes) may be formed on the top surface of first substrate 110 depending on the desired implementation.

Also, each of the optical elements 132 located in the through-holes of second substrate 130 may be a lens made of plastic material. As described in more detail below, optical elements 132 may be formed in the through holes of second substrate 130 by shaping the plastic material by means of a molding process such as injection molding process. For the molding process, at least one of ultraviolet curing resin and/or thermosetting resin may be used as the material of optical elements 132. In some embodiments, an ultraviolet curing resin may be used in the mold process to reduce the entire process time.

In some embodiments, a thermal expansion coefficient of second substrate 130 may be configured to be substantially the same or similar to (i.e., thermally compatible with) a thermal expansion coefficient of first substrate 110. In this configuration, second substrate 130 may maintain the initial dimensions (e.g., width, length and height) of the substrate and the through-holes formed in the substrate relative to the dimensions of first substrate 110 and light-receiving elements 112 formed in first substrate 110. Accordingly, each of optical elements 132 in second substrate 130 can be configured to align a corresponding one of light receiving elements 112 in first substrate 110 with high precision over the entire wafer plane.

For example, first substrate 110 may be made of silicon material with a thermal expansion coefficient of about $2.5 \times 10^{-6}$ to $4.3 \times 10^{-6}/°C$. Further, second substrate 130 may be made of silicon material with a substantially same thermal expansion coefficient as first substrate 110. Additionally or alternatively, quartz glass material such as Pyrex glass with a thermal expansion coefficient of $3.2 \times 10^{-6}/°$ C., and/or ceramic material such as $Si_3N_4$ with a thermal expansion coefficient of about $2.6 \times 10^{-6}/°$ C. or $Al_2O_3$ with a thermal expansion coefficient of about $7.2 \times 10^{-6}/°$ C. may be selected because these materials have substantially similar (i.e., compatible) thermal expansion coefficients to the silicon material used for first substrate 110.

In some embodiments, the thickness of each substrate 110 or 130 may be set to be a certain value such that the thickness of the substrate 110 or 130 may be reduced as much as possible while maintaining its stiffness and shape. For example, the thickness of each substrate 110 or 130 may be set to be in a range of about 0.1 mm to about 3 mm. In particular, substrate 110 or 130 made of silicon material may have a thickness in a range of about 0.2 mm to about 3 mm. Also, substrate 130 made of glass material may have a thickness of about 0.1 mm.

In some embodiments, the entire structure including optical devices 100 may be diced into multiple optical devices 100 each including a corresponding pair of light-receiving element 112 and optical element 132, as outlined by a dotted line A in FIG. 1. Each optical device 100 may be used as an image sensing module or a light-receiving module in an electronic device such as a mobile phone.

Figure 2:
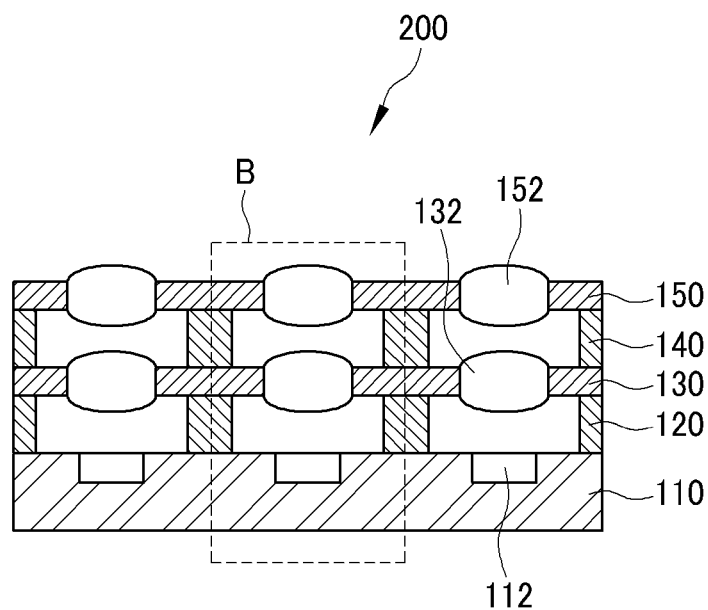
FIG. 2 schematically shows a cross-sectional view of another illustrative optical device.

FIG. 2 schematically shows a cross-sectional view of another illustrative optical device 200, which is arranged in accordance with at least some embodiments described herein. Similar to the optical devices described with reference to FIG. 1, the optical devices illustrated by FIG. 2 can be configured to include first substrate 110 including multiple light-receiving devices 112 on a top surface of first substrate 110. On first substrate 110, second substrate 130 including multiple optical elements 132 located in multiple through-holes is disposed via spacer substrate 120. In FIG. 2, similar elements to those shown in FIG. 1 are indicated with similar reference numerals, and thus a description thereof will be omitted for the sake of simplicity.

As shown, on second substrate 130, third substrate 150 including multiple optical elements 152 located in multiple through-holes may be disposed via spacer substrate 140. Although spacer substrate 140 is illustrated in FIG. 2, third substrate 150 may be configured to be disposed on second substrate 130 without spacer substrate 140. In some embodiments, spacer substrate 140 may be integrated into either second substrate 130 or third substrate 150.

In some embodiments, each of the optical elements 152 located in the through-holes of third substrate 150 may be a lens made of plastic material. As described in more detail below, optical elements 152 may be formed in the through holes of third substrate 150 by shaping the plastic material by means of a molding process such as injection molding process. For the molding process, at least one of ultraviolet curing resin and/or thermosetting resin may be used for the material of optical elements 152.

In some embodiments, a thermal expansion coefficient of third substrate 150 may be configured to be substantially the same or similar to (i.e., thermally compatible with) a thermal expansion coefficient of either second substrate 130 or first substrate 110. In this configuration, third substrate 150 may maintain the initial dimensions (e.g., width, length and height) of the substrate and the through-holes formed in the substrate relative to the dimensions of first substrate 110 and light-receiving elements 112 formed in first substrate 110. Also, third substrate 150 may maintain the initial dimensions of the substrate and the through-holes formed in the substrate relative to the dimensions of second substrate 130 and optical elements 132 formed in second substrate 130. Accordingly, each of optical elements 152 in third substrate 150 can be configured to align a corresponding one of light one of light receiving elements 112 in first substrate 110 or a corresponding one of optical elements 132 in second substrate 130 with high precision over the entire wafer plane.

For example, third substrate 150 may be made of silicon material with a substantially same thermal expansion coefficient as first substrate 110. Alternatively, third substrate 150 may be made of quartz glass material such as Pyrex glass, and/or ceramic material such as $Si_3N_4$ or $Al_2O_3$ with a thermal expansion coefficient similar to the silicon material used for first substrate 110.

Further, the thickness of third substrate 150 may be set to be a certain value such that the thickness of the substrate may be reduced as much as possible while maintaining its stiffness and shape. For example, the thickness of third substrate 150 may be set to be in a range of about 0.1 mm to about 3 mm. In particular, substrate 150, in case of being made of silicon material, may have a thickness in a range of about 0.2 mm to about 3 mm. Also, substrate 150, in case of being made of glass material, may have a thickness of about 0.1 mm.

In some embodiments, the entire structure including optical devices 200 may be diced into multiple optical devices 200 each including a corresponding set of light-receiving element 112 and optical elements 132 and 152, as outlined by a dotted line B in FIG. 2. Each optical device 200 may be used as an image sensing module or a light-receiving module in an electronic device such as a mobile phone.

In the above embodiments, one or two substrates 130 and 150 including optical elements 132 and 152, respectively, may be provided in the optical devices 100 or 200. However, any other suitable number (e.g., three or more) of substrates including same or different types of optical elements may be provided depending on the desired implementation.

Figure 3:
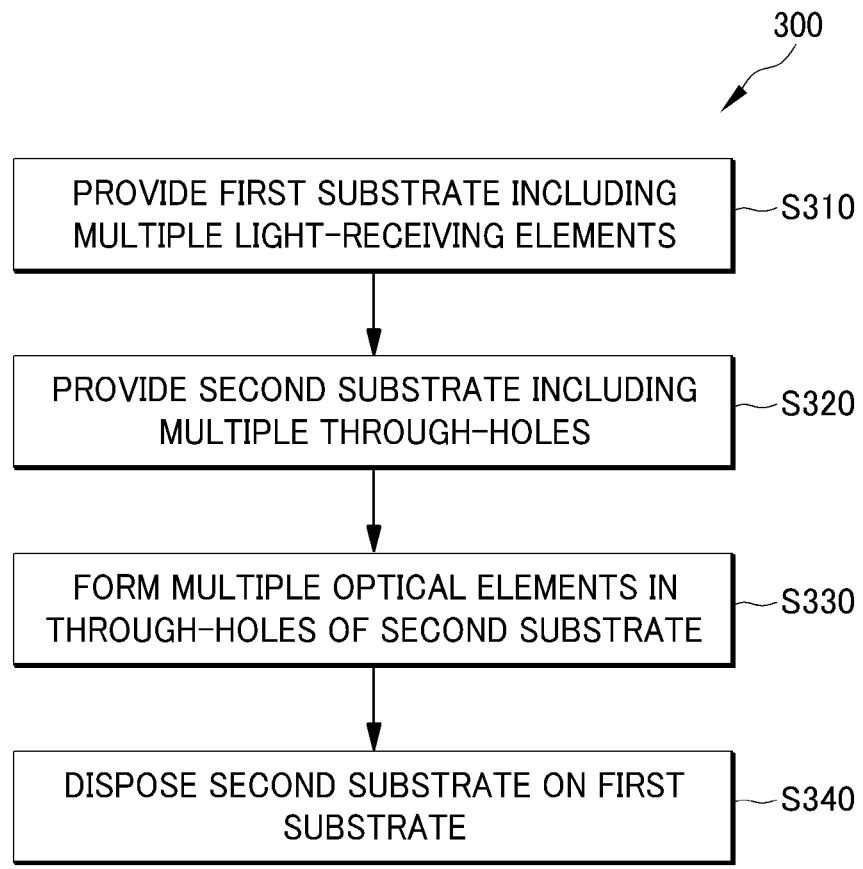
FIG. 3 shows an example flowchart of a method adapted to fabricate an optical device.

FIG. 3 shows an example flowchart of a method adapted to fabricate an optical device, arranged in accordance with at least some embodiments described herein. An example method 300 in FIG. 3 may be implemented using, for example, a computing device including a processor adapted to control a semiconductor processing device to manufacture optical devices.

Method 300 may include one or more operations, actions, or functions as illustrated by one or more of blocks S310, S320, S330 and/or S340. Although illustrated as discrete blocks, various blocks may be divided into additional blocks, combined into fewer blocks, or eliminated, depending on the desired implementation. In some further examples, the various described blocks may be implemented as a parallel process instead of a sequential process, or as a combination thereof.

Figure 4:
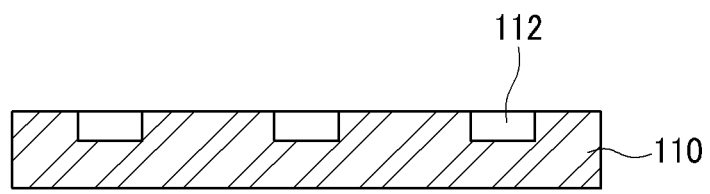
FIG. 4 schematically shows a cross-sectional view of an illustrative process for fabricating a substrate including multiple light-receiving elements.

Method 300 may begin at block S310. At block S310, a first substrate is provided that includes multiple light-receiving elements. FIG. 4 schematically shows a cross-sectional view of an illustrative process for fabricating a substrate including multiple light-receiving elements, in accordance with various embodiments described herein. As shown in FIG. 4, first substrate 110 such as a wafer may be prepared that includes multiple light-receiving elements 112 such as PDs and CCDs on an upper side thereof. In some other embodiments, first substrate 110 may include multiple light-emitting elements such as LDs and LEDs, instead of light-receiving elements 112.

In some embodiments, first substrate 110 may be made of silicon material with a thermal expansion coefficient of about $2.5 \times 10^{-6}$ to $4.3 \times 10^{-6}/°$ C. Also, in case of using photodiodes (PDs) as light-receiving elements 112 on first substrate 110, PDs may be manufactured on the basis of silicon material. Thus, light-receiving elements may be formed on first substrate 110 using any suitable semiconductor processing technology known in the art. Alternatively, multiple light-receiving elements may be prepared on a separate substrate, which may be diced into multiple chips each including a corresponding light-receiving element. The diced chips may then be adhered to first substrate 110 to form a corresponding number of light-receiving elements 112 on the upper side of first substrate 110. Specifically, each of the diced chips may be welded to the upper side of first substrate 110 via conductive material with a low melting point, such as gold (Au) or Tin-based alloys (e.g., In—Sn alloys, Pb—Sn alloys, etc.). This process may be useful in manufacturing high-priced and high-performance image sensors, such CCDs or CMOS (complementary metal-oxide semiconductor) sensors because an image sensor with high quality can be selectively diced out of the substrate.

Figure 5:
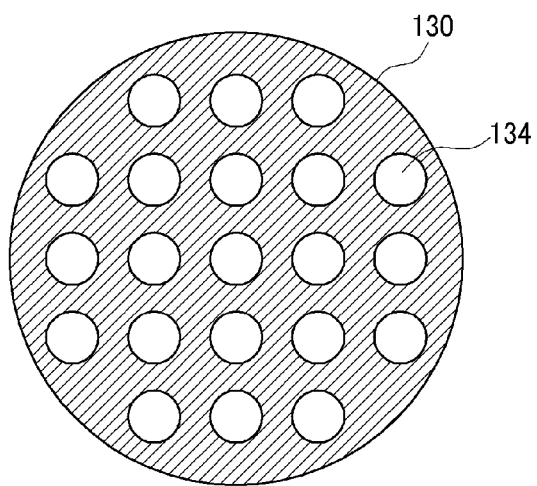
FIG. 5 schematically shows a plane view of an illustrative substrate including multiple through-holes where multiple optical elements are to be located.

Block S310 may be followed by block S320. At block S320, a second substrate can be provided that includes multiple through-holes. FIG. 5 schematically shows a plane view of an illustrative substrate including multiple through-holes where multiple optical elements are to be located, in accordance with various embodiments described herein. In some embodiments, as shown in FIG. 5, second substrate 130 may include multiple through-holes 134, at each of which a corresponding optical element such as lens may be formed. Through-holes 134 can be formed in second substrate 130 by high-precision semiconductor fabrication process such as machine cutting, dry etching, laser machining, etc.

In some embodiments, a thermal expansion coefficient of second substrate 130 may be configured to be substantially the same as a thermal expansion coefficient of first substrate 110. In this configuration, second substrate 130 may maintain its initial dimensions (e.g., width, length and height) relative to the dimensions of first substrate 110, even after going through a molding process for forming optical elements in second substrate 130, which will be described later. For example, second substrate 130 may be made of silicon (Si) material with a substantially same thermal expansion coefficient as first substrate 110. Alternatively, second substrate 130 may be made of quartz glass material such as Pyrex glass and/or ceramic material such as $Si_3N_4$ or $Al_2O_3$.

In some embodiments, the thickness of the second substrate 130 may be set to be a certain value such that the thickness of the substrate may be reduced as much as possible while maintaining its stiffness and shape. For example, the thickness of second substrate 130 may be set to be in a range of about 0.2 mm to about 3 mm if second substrate 130 is made of silicon (Si) material. Alternatively, second substrate 130 made of glass material (e.g., quartz glass, synthesized fused silica, etc.) may have a thickness of about 0.1 mm.

Block S320 may be followed by block S330. At block S330, multiple optical elements may be formed in the through-holes of the second substrate. As a result, each of the multiple through-holes may include a corresponding one of the multiple optical elements formed therein. In some embodiments, the multiple optical elements may be formed in the second substrate by shaping a plastic material by means of molding.

Figure 6:
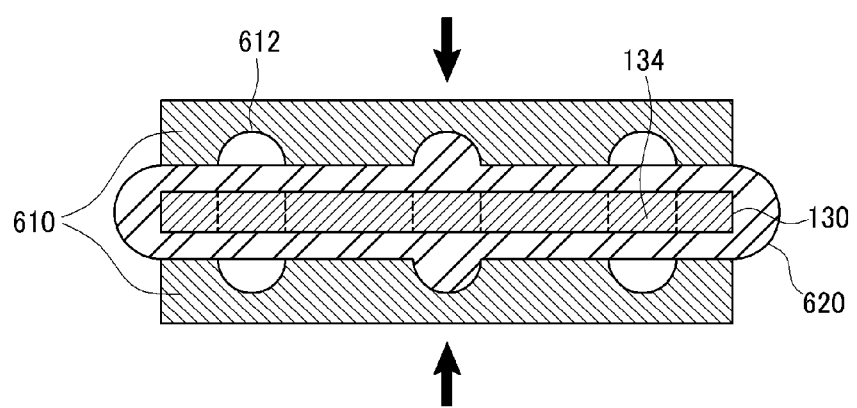
FIG. 6 schematically shows a cross-sectional view of an illustrative molding process for forming multiple optical elements in a substrate.

FIG. 6 schematically shows a cross-sectional view of an illustrative molding process for forming multiple optical elements in multiple through-holes 134 in second substrate 130, in accordance with at least some examples described herein. As shown in FIG. 6, mold assembly 610 may include mold cavities 612 shaped to form the optical elements in the through-holes is provided. Plastic material 620 may be then injected or introduced into mold cavities 612. In some embodiments, plastic material 620 may include at least one of ultraviolet curing resin and/or thermosetting resin. Subsequently, the upper and lower pieces of mold assembly 610 may be pressed against second substrate 130 interposed between the two pieces of mold assembly 610. Plastic material 620 may then be cured to form the optical elements in through holes 134.

The molding conditions for plastic material 620 may change depending on various factors such as the size of second substrate 130, the shape of the mold cavities 612 in mold assembly 610, the type of plastic material 620, etc. For example, if a 6-inch wafer is used as second substrate 130, each optical element has a diameter of about 2-3 mm and a thickness of about 1 mm, and plastic material 620 has a viscosity coefficient of about 1,000 cps, a pressing force of about several 10 kN may be required to apply to mold assembly 610 for about several minutes.

Referring back to FIG. 3, block S330 may be followed by block S340. At block S340, the second substrate may be disposed on the first substrate. This process may be performed in such a manner that each of the multiple optical elements may be substantially aligned with a corresponding one of the multiple light-receiving elements. In some embodiments, this process may include aligning and bonding the second substrate including multiple optical elements with the first substrate including multiple light-receiving elements.

Figure 7:
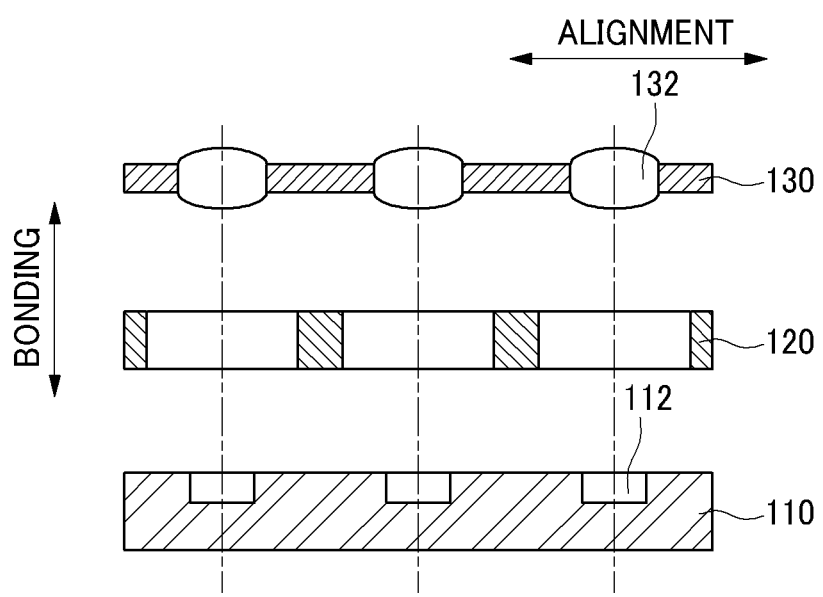
FIG. 7 schematically shows a cross-sectional view of an illustrative process for aligning and bonding a substrate including multiple optical elements with another substrate including multiple light-receiving elements, all arranged in accordance with at least some embodiments described herein.

FIG. 7 schematically shows a cross-sectional view of an illustrative process for aligning and bonding second substrate 130 including multiple optical elements 132 with first substrate 110 including multiple light-receiving elements 112, in accordance with at least some examples described herein. As illustrated, the aligning process may be performed such that a position of each optical element 132 of second substrate 130 may be aligned with a position of a corresponding light-receiving element 112 of first substrate 110.

In some embodiments, one or more light sources (not shown) may be provided above second substrate 130 to irradiate a light through each of optical elements 132 onto the corresponding one of light-receiving elements 112. Based on the light intensity detected by light-receiving elements 112, the position of each optical element 132 may be adjusted relative to the corresponding one of light-receiving elements 112.

In some embodiments, the bonding process may be performed after the aligning process is completed. The boding process may be performed using any suitable bonding material and technique known in the art. For example, an ultraviolet curing resin may be applied at one or more predetermined positions on first substrate 110 prior to disposing second substrate 130 on first substrate 110. Specifically, the ultraviolet curing resin may be applied at positions on first substrate 110 where first substrate 110 may make contact with spacer substrate 120. Also, the ultraviolet curing resin may be applied at positions on spacer substrate 120 where spacer substrate 120 makes contact with second substrate 130. Although spacer substrate 120 is described to be interposed between first and second substrates 110 and 130 in FIG. 7, first substrate 110 may be configured to make contact with second substrate 130 without spacer substrate 120. The ultraviolet curing resin applied at the predetermined positions may then be cured by irradiating an ultraviolet light onto the resin.

One skilled in the art will appreciate that, for this and other methods disclosed herein, the functions performed in the methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An optical device, comprising:
   a first substrate including light-receiving elements;
   a second substrate disposed on the first substrate, wherein the second substrate includes optical elements located within through-holes of the second substrate, and the through-holes are configured to substantially align each of the optical elements in the second substrate with a corresponding one of the light-receiving elements in the first substrate;
   a spacer substrate disposed between the first substrate and the second substrate; and
   one or more light sources provided above the second substrate, wherein the one or more light sources are configured to irradiate a light through each of the optical elements in the second substrate onto the corresponding one of the light-receiving elements in the first substrate such that a position of each of the optical elements in the second substrate is adjusted relative to the corresponding one of the light-receiving elements in the first substrate based on a light intensity detected by the light-receiving elements.

2. The optical device of claim 1, wherein a thermal expansion coefficient of the first substrate is substantially the same as a thermal expansion coefficient of the second substrate.

3. The optical device of claim 1, wherein the spacer substrate comprises at least one of quartz glass material and/or silicon material.

4. The optical device of claim 1, wherein the first substrate comprises silicon material.

5. The optical device of claim 1, wherein the second substrate comprises at least one of quartz glass material, silicon material and/or ceramic material.

6. The optical device of claim 5, wherein the ceramic material comprises one or more materials selected from the group consisting of $Si_3N_4$ and/or $Al_2O_3$.

7. The optical device of claim 1, wherein the optical elements in the first substrate comprise plastic material.

8. The optical device of claim 7, wherein the plastic material comprises at least one of ultraviolet curing resin and/or thermosetting resin.

9. The optical device of claim 1, wherein the spacer substrate comprises at least one of quartz glass material and/or silicon material.

10. The optical device of claim 1, wherein the optical elements include lenses.

11. An optical device, comprising:
    a first substrate including light-receiving elements;
    a spacer substrate disposed on the first substrate;
    a second substrate disposed on the spacer substrate, wherein:
       the second substrate includes optical elements located within through-holes of the second substrate,
       the optical elements include lenses,
       the through-holes are configured to substantially align each optical element with a corresponding light-receiving element in the first substrate, and
       a thermal expansion coefficient of the first substrate is substantially the same as a thermal expansion coefficient of the second substrate; and
    one or more light sources provided above the second substrate, wherein the one or more light sources are configured to irradiate a light through each of the optical elements in the second substrate onto the corresponding one of the light-receiving elements in the first substrate such that a position of each of the optical elements in the second substrate is adjusted relative to the corresponding one of the light-receiving elements in the first substrate based on a light intensity detected by the light-receiving elements.

12. The optical device of claim 11, wherein the first substrate comprises silicon material.

13. The optical device of claim 11, wherein the second substrate comprises ceramic material, and the ceramic material comprises one or more materials selected from the group consisting of $Si_3N_4$ and $Al_2O_3$.

14. The optical device of claim 11, wherein the optical elements in the second substrate comprise plastic material.

15. The optical device of claim 11, wherein the spacer substrate comprises at least one of quartz glass material and/or silicon material.

16. The optical device of claim 11, wherein the second substrate comprises at least one of quartz glass material, silicon material and/or ceramic material.

17. A method for fabricating an optical device, comprising:
    providing a first substrate including a plurality of light-receiving elements, wherein the plurality of light-receiving elements are formed from a plurality of semiconductor photodiodes in a silicon substrate corresponding to the first substrate;
    providing a second substrate including a plurality of through-holes;
    forming a plurality of optical elements in the through-holes of the second substrate such that each of the plurality of through-holes includes a corresponding one of the plurality of optical elements;
    disposing the second substrate on the first substrate such that each of the plurality of optical elements is substantially aligned with a corresponding one of the plurality of light-receiving elements, wherein a thermal expansion coefficient of the first substrate is substantially the same as a thermal expansion coefficient of the second substrate; and
    providing one or more light sources above the second substrate, wherein the one or more light sources are configured to irradiate a light through each of the plurality of optical elements in the second substrate onto the corresponding one of the plurality of light-receiving elements in the first substrate such that a position of each of the plurality of optical elements in the second substrate is adjusted relative to the corresponding one of the plurality of light-receiving elements in the first substrate based on a light intensity detected by the plurality of light-receiving elements.

18. The method of claim 17, further comprising forming the first substrate by:
    providing a third substrate including the plurality of light-receiving elements;
    dicing the third substrate into a plurality of chips each including a corresponding light-receiving element; and
    adhering the plurality of diced chips onto the first substrate.

19. The method of claim 17, further comprising forming a plurality of optical elements in the through-holes of the second substrate by:
    providing a mold assembly having a mold cavity shaped to form the optical elements in the plurality of through-holes;
    introducing a plastic material into the mold cavity; and
    curing the plastic material to form each of the plurality of optical elements in the plurality of through-holes.

20. The method of claim 17, further comprising:
    disposing a spacer substrate between the first substrate and the second substrate.

21. The method of claim 17, further comprising forming a spacer substrate between the first substrate and the second substrate by:
- applying an ultraviolet curing resin on the first substrate prior to disposing the second substrate on the first substrate; and
- curing the ultraviolet curing resin by irradiating an ultraviolet light thereto.

22. The method of claim 17, wherein disposing the second substrate on the first substrate such that of the plurality of optical elements is substantially aligned further comprises:
- aligning a position of each optical element of the second substrate with a position of a corresponding light-receiving element of the first substrate.

\* \* \* \* \*